United States Patent
Symes et al.

(10) Patent No.: US 7,895,417 B2
(45) Date of Patent: Feb. 22, 2011

(54) SELECT-AND-INSERT INSTRUCTION WITHIN DATA PROCESSING SYSTEMS

(75) Inventors: Dominic Hugo Symes, Cambridge (GB); Daniel Kershaw, Cambridge (GB); Mladen Wilder, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/662,734

(22) Filed: Apr. 30, 2010

(65) Prior Publication Data

US 2010/0217958 A1    Aug. 26, 2010

Related U.S. Application Data

(62) Division of application No. 12/068,903, filed on Feb. 13, 2008, now Pat. No. 7,814,302.

(30) Foreign Application Priority Data

Mar. 12, 2007   (GB) ................. 0704735.0

(51) Int. Cl.
  *G06F 7/38*   (2006.01)
  *G06F 9/00*   (2006.01)
  *G06F 9/44*   (2006.01)
  *G06F 15/00*  (2006.01)
(52) U.S. Cl. .................................................. 712/220
(58) Field of Classification Search ............... 712/220
  See application file for complete search history.

(56) References Cited

U.S. PATENT DOCUMENTS 3,735,355 A    5/1973   Balogh et al.

(Continued)

FOREIGN PATENT DOCUMENTS

GB    2 402 757    12/2004

(Continued)

OTHER PUBLICATIONS

Lee et al.; Design of New DSP Instructions and their Hardware Architecture for the Viterbi Decoding Algorithm; 2002; IEEE.*

(Continued)

*Primary Examiner*—Eddie P Chan
*Assistant Examiner*—Corey Faherty
(74) *Attorney, Agent, or Firm*—Nixon & Vanderhye P.C.

(57) ABSTRACT

A data processing system 2 is provided including an instruction decoder 34 responsive to program instructions within an instruction register 32 to generate control signals for controlling data processing circuitry 36. The instructions supported include an address calculation instruction which splits an input address value at a position dependent upon a size value into a first portion and second portion, adds a non-zero offset value to the first portion, sets the second portion to a value and then concatenates the result of the processing on the first portion and the second portion to form the output address value. Another type of instruction supported is a select-and-insert instruction. This instruction takes a first input value and shifts it by N bit positions to form a shifted value, selects N bits from within a second input value in dependence upon the first input value and then concatenates the shifted value with the N bits to form an output value. The address calculation instruction and the select-and-insert instruction described above are useful when manipulating two-dimensional data arrays, and particularly so when these are two-dimensional data arrays are formed of Viterbi trellis data through which traceback operations are to be performed.

20 Claims, 9 Drawing Sheets

U.S. PATENT DOCUMENTS

| | | | |
|---|---|---|---|
| 5,179,676 | A | 1/1993 | Kashima |
| 5,487,159 | A | 1/1996 | Byers et al. |
| 5,490,178 | A * | 2/1996 | Blaker et al. ............... 375/341 |
| 5,537,445 | A * | 7/1996 | Blaker et al. ............... 375/341 |
| 5,724,621 | A * | 3/1998 | Serita et al. ............... 396/284 |
| 5,987,490 | A * | 11/1999 | Alidina et al. ............. 708/523 |
| 6,148,388 | A | 11/2000 | Wu et al. |
| 7,047,396 | B1 | 5/2006 | Fotland et al. |
| 2004/0193848 | A1 | 9/2004 | Tavares |
| 2005/0188182 | A1 | 8/2005 | Hoyle et al. |

FOREIGN PATENT DOCUMENTS

| | | |
|---|---|---|
| GB | 2 411 978 | 9/2005 |
| WO | WO 2006/039055 A1 | 4/2006 |

OTHER PUBLICATIONS

Great Britain Search Reports for GB 0704735.0 dated Sep. 20, 2007 and May 23, 2007.

* cited by examiner register specified input address: Offset
register specified set value: State
size: LogMask
maddr_u32 [ Offset, State, LogMask ]
Fig. 9
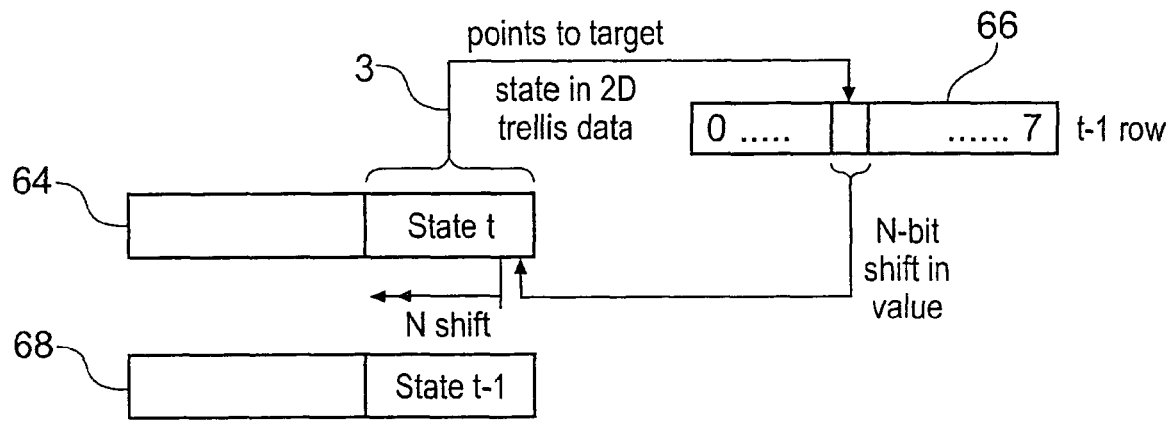
Fig. 10
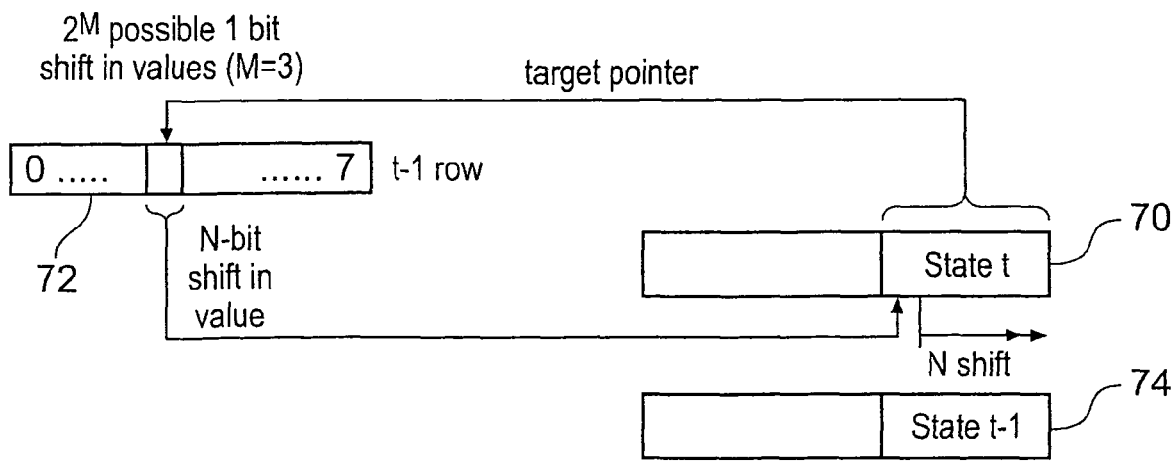
Fig. 11

```
for ( c=0; c<2; c++){

State  = sib_u32 (State, d4);
    Offset = maddr_u32 (Offset, State, logMask);
    d4     = Trellis In [Offset];

State  = sib_u32 (State, d3);
    Offset = maddr_u32 (Offset, State, logMask);
    d3     = Trellis In [Offset];

State  = sib_u32 (State, d2);
    Offset = maddr_u32 (Offset, State, logMask);
    d2     = Trellis In [Offset];

State  = sib_u32 (State, d1);
    Offset = maddr_u32 (Offset, State, logMask);
    d1     = Trellis In [Offset];

VM Implementation

… # SELECT-AND-INSERT INSTRUCTION WITHIN DATA PROCESSING SYSTEMS

This application is a Division of application Ser. No. 12/068,903, filed Feb. 13, 2008 now U.S. Pat. No. 7,814,302, which claims priority to GB Application No. 0704735.0 filed 12 Mar. 2007. The entire contents of these applications are incorporated herein by reference.

BACKGROUND OF THE INVENTION

1. Field of the Invention

This invention relates to the field of data processing systems. More particularly, this invention relates to data processing systems supporting program instructions tailored to high data throughput requirements.

2. Description of the Prior Art

It is known within data processing systems to perform data processing operations which require a high data throughput and the manipulation of large amounts of data. An example of such manipulations are Viterbi algorithm calculations commonly used when transmitting data over a noisy communication channel. While these techniques can be highly successful in resisting data loss arising due to noise on the channel, they bring with them a high computational load. These high levels of computation present a significant challenge in producing low overhead (in terms of size, cost and energy consumption) systems capable of performing the required processing.

One particular challenge within Viterbi decoding is that the trellis traceback algorithm requires access to a two-dimensional array of data values with one dimension of the array being stepped through at a constant rate and the other dimension being accessed "randomly" depending upon the current state of the decoder.

Known software Viterbi implementations (e.g. C54x) implement these requirements by using one instruction to step through the dimension which changes at a constant rate and another instruction to apply the value for the randomly accessed dimension when seeking to form the composite address for accessing the two-dimensional array.

SUMMARY OF THE INVENTION

Viewed from one aspect the present invention provides apparatus for processing data comprising:

data processing circuitry responsive to control signals to perform data processing operations; and instruction decoder circuitry coupled to said data processing circuitry and responsive to program instructions to generate said control signals; wherein said instruction decoder circuitry is responsive to an address calculation instruction having as input operands at least an input address value and a size value to generate control signals to control said data processing circuitry to calculate an output address value equal to that given by performing the steps of:

splitting said input address value at a position dependent upon said size value into an input first portion and an input second portion;

adding a non-zero offset value to said input first portion to form an output first portion;

setting an output second portion to a second portion value; and concatenating said output first portion and said output second portion to form said output address value.

The present technique recognises that in some circumstances, particularly those seeking high levels of efficiency, the need to use two separate instructions to separately apply the changes to the two dimensions being used to access the two-dimensional array can adversely constrain the system design by requiring a higher number of instruction cycles, or a higher frequency, in order to achieve a required data throughput with its associated number of address calculations being made to access the data. As well as recognising this constraint, the invention provides the solution of an address calculation instruction which as part of one operation splits an input address value into two input portions, separately manipulations those input portions in the required manner and then concatenates the results to form an output address value. Moreover, given the constraints of instruction bit space available when specifying a program instruction, the address calculation instruction of the present technique focuses the manipulations to be performed on those identified as frequently required in the performance the constraining environments identified, namely adding a non-zero offset value to a first portion and setting a second portion to a value. This reduces the number of instructions needing to be executed to achieve a desired, relatively common and performance constraining processing requirement in a manner which advantageously enables more efficient operation of the system as a whole.

Whilst it will be appreciated that the address calculation instruction could be used for a variety of different purposes, it is particularly well suited for accessing a two-dimensional array of data values within a memory where a first coordinate corresponds to the first output portion and a second coordinate corresponds to the second output portion.

The size value used to specify the point at which the input address value is split prior to manipulation is an input to the address calculation instruction and effectively defines the low order bit portion of the instruction, which has a range of $2^M$ possible values.

The non-zero offset value can be specified in a variety of different ways, as will be familiar to those in this technical field. Particularly suitable ways in the present context are as a register specified value or as a value specified as an offset immediate value within the address calculation instruction itself. In a similar way, the second portion value to which the output second portion is to be set can be specified in a variety of different ways including being at least part of a register specified value (e.g. a register value subject to some variable masking etc).

The size value can be similarly specified in a variety of different ways, e.g. as a mask value, a value being a power of two, or a logarithmic value.

The non-zero offset value is also optionally an input operand to the address calculation instruction rather than being hardcoded therein. The non-zero offset value in many cases will perform upon the input first portion one of a decrement or an increment with a regular step to form the output first portion.

Whilst the data to be manipulated within the two-dimensional array of data values can take a variety of different forms, the present techniques are particularly well suited to the manipulation of Viterbi trellis data values.

Embodiments taking good advantage of the present technique are ones in which the data processing circuitry executes the address calculation instruction in a manner providing a throughput capable of forming one output address per clock cycle. Providing an instruction with the ability to perform the desired manipulations in one operation increases the code density as a first consequence and also increases the throughput capabilities, particularly when the instruction is made a single cycle instruction.

Viewed from another aspect the present invention provides a method of processing data using data processing circuitry responsive to control signals to perform data processing operations and instruction decoder circuitry coupled to said data processing circuitry and responsive to program instructions to generate said control signals, said method comprising the steps of:

decoding an address calculation instruction having as input operands at least an input address value and a size value to generate controls signals; and controlling said data processing circuitry with said control signals to calculate an output address value equal to that given by performing the steps of:

splitting said input address value at a position dependent upon said size value into an input first portion and an input second portion;

adding a non-zero offset value to said input first portion to form an output first portion;

setting an output second portion to a second portion value; and concatenating said output first portion and said output second portion to form said output address value.

Viewed from a further aspect the present invention provides apparatus for processing data comprising:

data processing, means for performing data processing operations in response to control signals; and instruction decoder means coupled to said data processing means for generating said control signals in response to program instructions; wherein said instruction decoder means, in response to an address calculation instruction having as input operands at least an input address value and a size value, generates controls signals to control said data processing means to calculate an output address value equal to that given by performing the steps of:

splitting said input address value at a position dependent upon said size value into an input first portion and an input second portion;

adding a non-zero offset value to said input first portion to form an output first portion;

setting an output second portion to a second portion value; and concatenating said output first portion and said output second portion to form said output address value.

Viewed from a further aspect the present invention provides a virtual machine implementation of an apparatus for processing data, said virtual machine implementation being responsive to an address calculation instruction having as input operands at least an input address value and a size value to calculate an output address value equal to that given by performing the steps of:

splitting said input address value at a position dependent upon said size value into an input first portion and an input second portion;

adding a non-zero offset value to said input first portion to form an output first portion;

setting an output second portion to a second portion value; and concatenating said output first portion and said output second portion to form said output address value.

Another problem situation that arises concerns the manipulation of data values in a manner that depends directly upon the data values to be manipulated. Conventionally this requires multiple instructions, i.e. first to examine the data to identify the manipulation to be performed and then to separately perform that manipulation.

Viewed from another aspect the present invention provides apparatus for processing data comprising:

data processing circuitry responsive to control signals to perform data processing operations; and instruction decoder circuitry coupled to said data processing circuitry and responsive to program instructions to generate said control signals; wherein said instruction decoder circuitry is responsive to a select-and-insert instruction having as input operands at least a first input value and a second input value to generate control signals to control said data processing circuitry to form an output value equal to that given by performing the steps of:

shifting said first input value by N bit positions to form a shifted value, where N is an integer value greater than zero;

selecting N bits from within said second input value in dependence upon said first input value; and concatenating said shifted value and said N bits to form said output value.

The present technique recognises the bottleneck that is introduced by the need to perform manipulations upon data values in dependence upon those data values themselves in circumstances where these manipulations are frequently required and where high data throughput is required. More particularly, the present technique recognises a particular class of such situations for which it is desirable to provide hardware support. These correspond to a select-and-insert instruction in which a first input value is shifted by a variable number N of bit positions to form a shifted value, N bits from within a second input value are selected in dependence of the first input value, and then the shifted value and the selected N bits are concatenated to form an output value. This particular combination of manipulations is one which is frequently required in certain fields where high volumes of data are to be processed, desirably with a high level of efficiency.

Whilst the above select-and-insert instruction could be used in other circumstances, it is particularly well suited to use when the first input value is a Viterbi decoder state value and the second input value is a Viterbi trellis data value. The instruction then provides a high efficiency mechanism for tracing back through the Viterbi trellis data values to reconstruct decoder state and decode the signals required.

It will be appreciated that the first input value could be left shifted with the N bits concatenated to form the least significant bits of the output data value. Alternatively, the first input value could be right shifted and the N bits concatenated with the shifted value to form the most significant bits of the output value. The number of bit positions shifted and the number of bits inserted can take a variety of values, but is often usefully one.

The present technique is well suited to pipelined implementation when the first input value is a Viterbi decoder state value, the second input value is a multi-bit Viterbi trellis data value loaded from a memory by a load instruction executed in a processing cycle preceding the processing cycle in which the select-and-insert instruction is executed. In these circumstances, the latency associated with accessing the Viterbi trellis data value with the load instruction can be compensated for since the bits which will be required from that Viterbi trellis data value to be inserted into the Viterbi decoder state value can be determined and selected later by the select-and-insert instruction. The load can thus effectively load all of the bit values which might be required and the select-and-insert instruction can then select the bit values which are actually required for the manipulation to be performed.

The provision of the select-and-insert instruction is complemented by the provision of the previously discussed address calculation instruction as together these instructions can significantly reduce the processing bottlenecks which would otherwise be present and obstruct a high efficiency implementation of, in particular, a Viterbi software decoder. This is particularly beneficial when the trellis is generated by parallel data processing units, such as in a SIMD machine. In this case the scalar traceback processing becomes a bottleneck.

Viewed from another aspect the present invention provides a method of processing data using data processing circuitry responsive to control signals to perform data processing operations and instruction decoder circuitry coupled to said data processing circuitry and responsive to program instructions to generate said control signals, said method comprising the steps of:

decoding a select-and-insert instruction having as input operands having as input operands at least a first input value and a second input value to generate control signals;

controlling said data processing circuitry with said control signals to calculate an output value equal to that given by performing the steps of:

shifting said first input value by N bit positions to form a shifted value, where N is an integer value greater than zero;

selecting N bits from within said second input value in dependence upon said first input value; and concatenating said shifted value and said N bits to form said output value.

Viewed from a further aspect the present invention provides apparatus for processing data comprising:

data processing means for performing data processing operations in response to control signals; and instruction decoder means coupled to said data processing means for generating said control signals in response to program instructions; wherein said instruction decoder means, in response to a select-and-insert instruction having as input operands at least an first input value and a second input value, generates controls signals to control said data processing means to calculate an output value equal to that given by performing the steps of:

shifting said first input value by N bit positions to form a shifted value, where N is an integer value greater than zero;

selecting N bits from within said second input value in dependence upon said first input value; and concatenating said shifted value and said N bits to form said output value.

Viewed from a further aspect the present invention provides a virtual machine implementation of an apparatus for processing data, said virtual machine implementation being responsive to a select-and-insert instruction having as input operands at least an first input value and a second input value to calculate an output value equal to that given by performing the steps of:

shifting said first input value by N bit positions to form a shifted value, where N is an integer value greater than zero;

selecting N bits from within said second input value in dependence upon said first input value; and concatenating said shifted value and said N bits to form said output value.

The above, and other objects, features and advantages of this invention will be apparent from the following detailed description of illustrative embodiments which is to be read in connection with the accompanying drawings.

BRIEF DESCRIPTION OF THE DRAWINGS

FIG. 9 illustrates the syntax of an address calculation instruction;

FIG. 10 schematically illustrates the operation of a select-and-insert instruction;

FIG. 11 schematically illustrates an alternative operation of a select-and-insert instruction;

FIG. 14 is an example code sequence illustrating the use of a select-and-insert instruction in combination with an address calculation instruction to perform Viterbi traceback operations.

DESCRIPTION OF THE PREFERRED EMBODIMENTS

Figure 1:
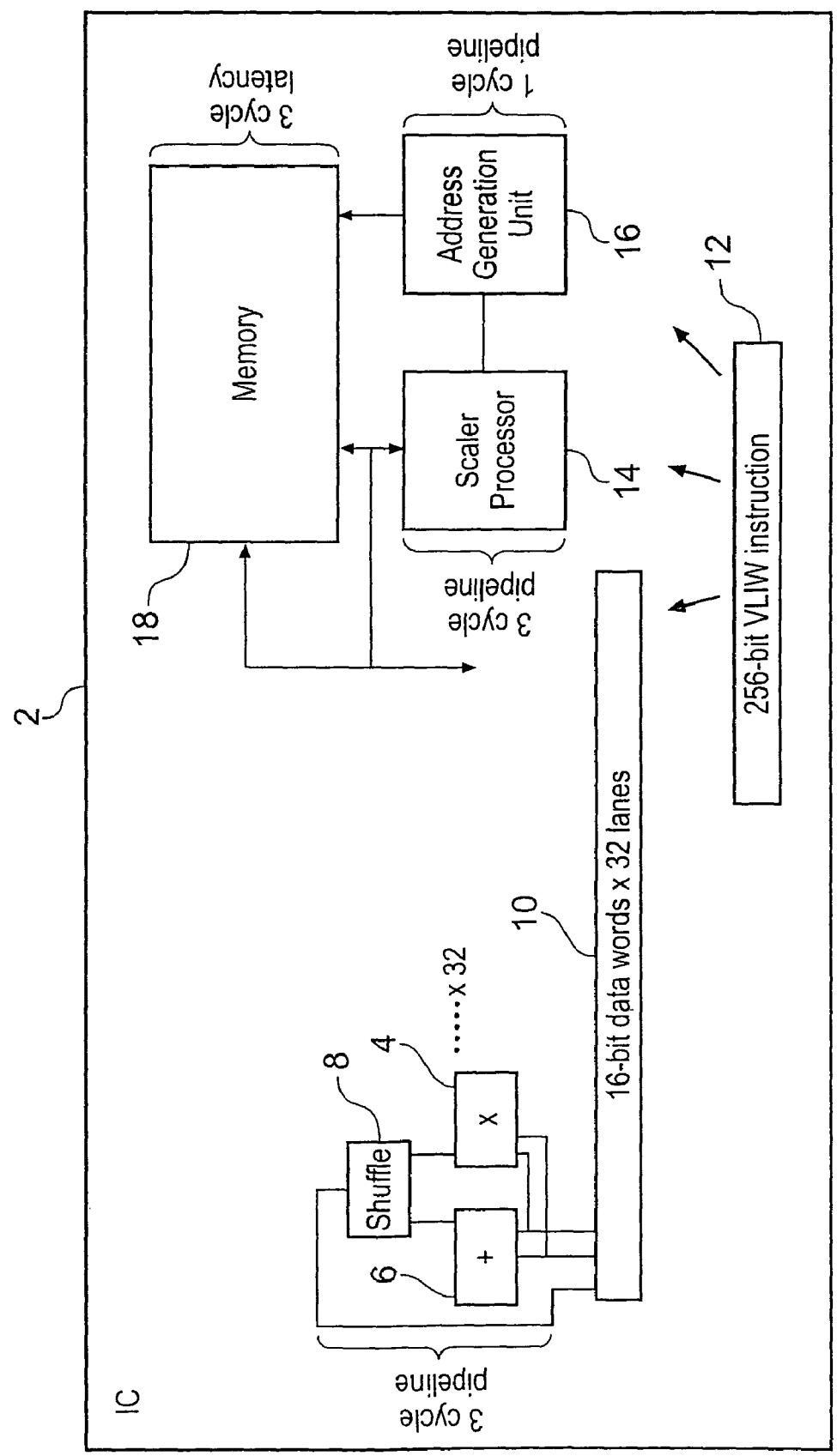
FIG. 1 schematically illustrates an integrated circuit suitable for software radio processing.

FIG. 1 shows an integrated circuit 2 adapted to perform software radio processing functions. Software radio places heavy demands upon the processing capabilities of such a programmable integrated circuit. The data throughputs required are large and it is important to balance the different elements provided within the integrated circuit 2 in order that all the elements are used with a high degree of efficiency. In the illustrated example, thirty-two parallel lanes, each sixteen bits wide, for performing multiplication, addition and shuffle operations upon arithmetic values are provided. Each of these lanes includes a multiplier 4, an adder 6 and a shuffle unit 8. 16-bit data words are taken from a respective lane within an input value register 10 to provide input operands to the multiplier 4, the adder 6 and the shuffle unit 8. The multiplier 4, the adder 6 and the shuffle unit 8 form a three-cycle deep pipeline such that the results of a calculation will be available three cycles after the calculation is issued into the pipeline. The respective processing lanes are controlled by a 256-bit very long instruction word (VLIW) instruction stored within an instruction register 12. This VLIW instruction also includes a scalar instruction supplied to a scalar processor 14.

The scalar processor 14 operates in parallel with the previously discussed thirty two parallel lanes and serves primarily to perform control and higher level decoding operations. The scalar processor 14 also controls an address generation unit 16 which is responsible for generating memory access addresses supplied to a memory 18 for accessing data values therefrom (which are fed to the operand register 10 for processing in the thirty two parallel lanes as well as to the scalar processor 14 itself). The scalar processor 14 also has a three-cycle pipeline depth and the memory 18 has a three-cycle latency. Matching the pipeline depths/latency of the address generation wait 16, the thirty-tw parallel lanes and the memory 18 simplifies efficient coding and allows more flexibility in the scheduling of instructions.

One of the tasks of the address generation unit 16 in performing Viterbi decoding is to undertake the traceback operations through the Viterbi trellis data which has been calculated by thirty-two parallel lanes. The thirty-two parallel lanes, each comprising a multiplier 4, an adder 6 and a shuffle unit 8, are responsible for the data processing necessary to compute the probability coefficients and branch values to be associated with each state node within the Viterbi decoding process. Such a highly parallel data processing engine is well suited to this computationally intensive task. Once the Viterbi trellis data has been calculated it is necessary to analyse this calculated data so as to extract therefrom the bit stream which has been decoded. This task is performed by the address generation unit 16. The thirty-two parallel lanes write the Viterbi trellis data to the memory 18 from where it is read and analysed by the address generation unit 16. The address generation unit 16 also tracks the Viterbi decoder state data which provides the decoded data stream.

Viterbi decoding in itself is a well known technique within the field of data and signal processing. Viterbi decoding will not be described herein in detail.

Figure 2:
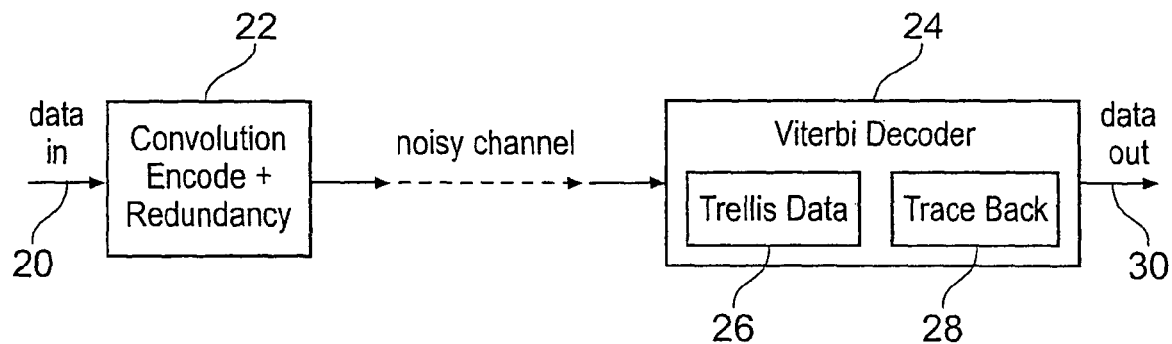
FIG. 2 schematically illustrates a Viterbi coding and decoding system.

FIG. 2 illustrates at a high level the processing that is performed. An input data stream 20 is subject to convolution encoding and the addition of some parity data by a convolutional encoder 22. This Viterbi encoded data is then transmitted over a noisy data channel (e.g. a wireless data channel) to a Viterbi decoder 24. The Viterbi decoder 24 applies Viterbi decoding algorithms to the received data to form Viterbi trellis data 26, which can then be subject to traceback processing by a traceback processor 28 to generate an output data stream 30 corresponding to the input datastream 20.

Figure 3:
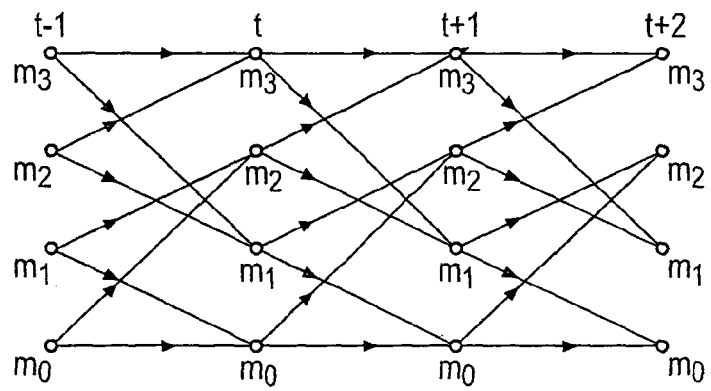
FIG. 3 schematically illustrates Viterbi trellis data.

FIG. 3 schematically illustrates Viterbi trellis data. In this example each Viterbi decoder state is taken to have four possible values, $m_3$-$m_0$. These four possible states at each time t have a value associated with them indicating how probable it is that the decoder has reached that state given the preceding sequence of bits that have been received. The transition from one possible decoder state to the next possible decoder state can have two potential targets selected between in dependence upon the received bit associated with that transition. The trellis data comprises a large number of computed elements representing the probabilities of states and the bit sequences which have led to those states. Calculating this trellis data is computationally intensive and is performed by the wide multi-lane data engine of illustrated in FIG. 1. When the trellis data has been formed in this way, another processing unit, such as the address generation unit 16 is used to analyse this trellis data and "traceback" therethrough. This type of processing is in itself known. It will be appreciated that in practice a Viterbi decoder will have many more than four possible states at each time making the Viterbi trace back data significantly larger in volume and more complex to analyse.

Figure 4:
FIG. 4 schematically illustrates updating of Viterbi decoder state data during traceback.

FIG. 4 schematically illustrates a small part of the traceback operation performed as part of typical Viterbi decoding. The decoder has been determined at time t to be in a given state that is most probable given the already decoded trellis data which has been traversed. Stored within the trellis data for the time t and the state at which the decoder is currently expressing is an indication of which preceding state at the time t-1 is the most probable preceding state. This indicates to which state the decoder is traced back to and the bit value which is deemed to have been decoded by that change of state. The change of state will also be accompanied by a change in the decoder state value which is achieved, in this example, by left shifting the current state value and shifting into the bottom of that state value a bit indicating which of the two options for the preceding bit has been deemed the most probable, and accordingly deemed to have been decoded. This shifted value with an inserted new bit then forms the new state of the decoder at time t-1. The process repeats at time t-1 and a further bit is decoded traceback through the Viterbi trellis data is so made.

Figure 5:
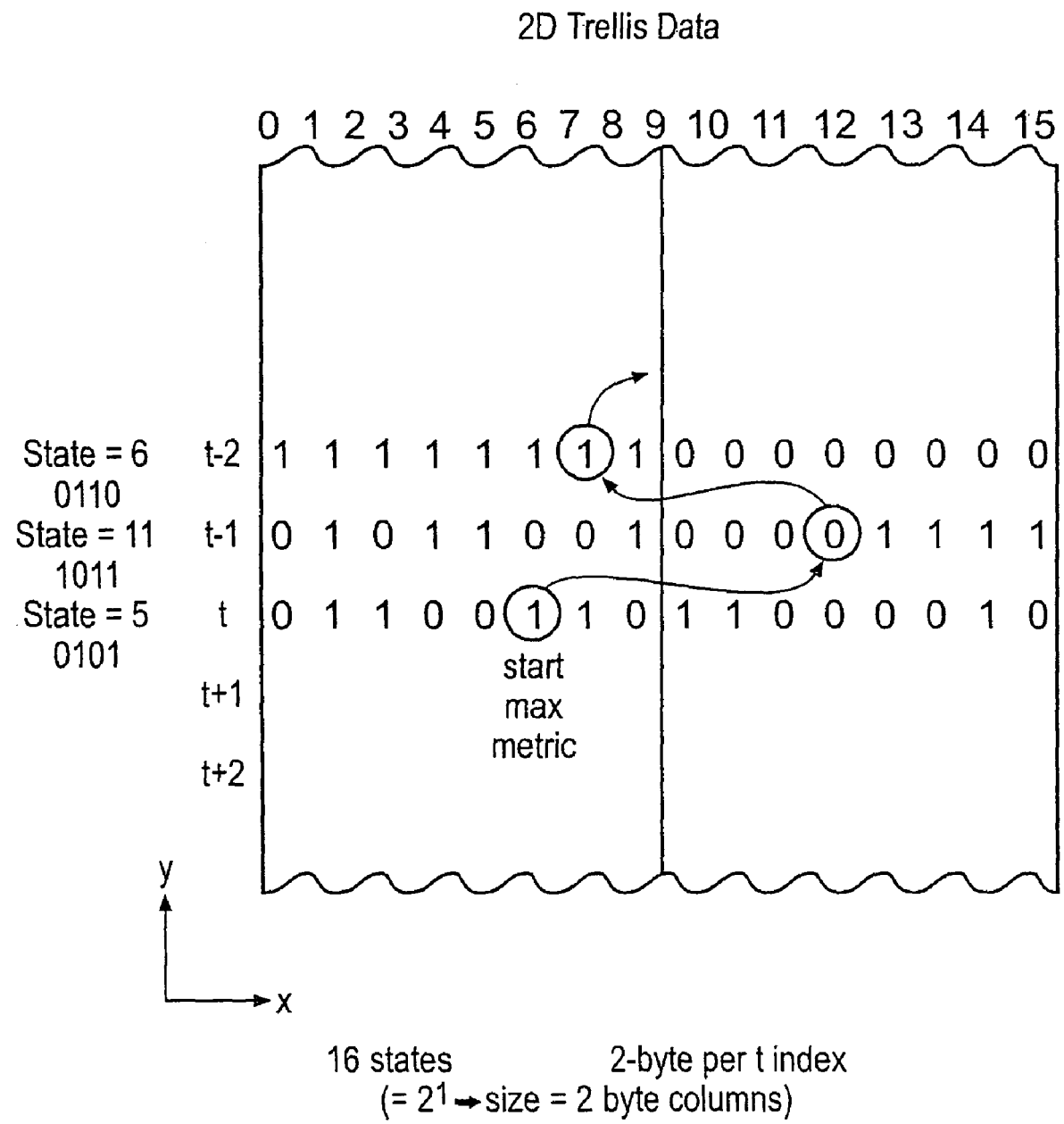
FIG. 5 schematically illustrates a two-dimensional array of Viterbi trellis data being traversed as part of a traceback operation.

FIG. 5 is another example illustration of this process. At the various times t the decoder state in this example can have sixteen possible values. With each of these values there is an associated bit indicating the most likely path by which that state will have been reached from the two possible preceding states at an earlier time. This path is then followed back to that preceding state, which will in itself have an indicator to the preceding state to which traceback is to be performed. Thus, in the example illustrated, the state at time t is "0101". The bit stored within the trellis data indicating the preceding state associated with that state is a "1" indicating that a "1" is to be shifted into the bottom of the state value as it is left shifted to form the state value for the preceding state at time t-1. In this way, the state value for the preceding state is formed as "1011". Data is stored within the trellis data associated with this state at time t-1 indicating the next state to be adopted. Thus, the trellis data shown in FIG. 5 is subject to a traceback operation during which the decoder state is updated and is used to generate the decoded data stream in accordance with known techniques.

Figure 6:
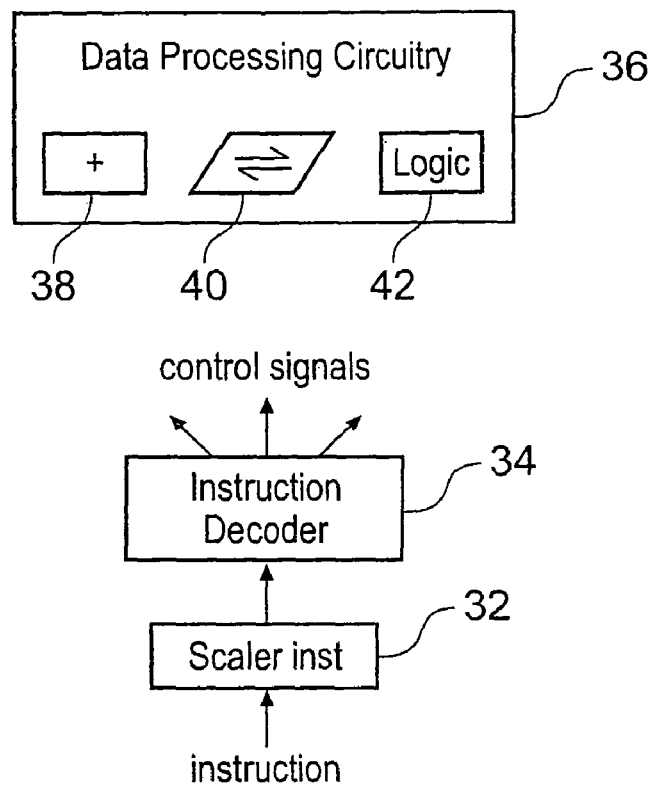
FIG. 6 schematically illustrates an instruction decoder responsive to program instructions for controlling data processing circuitry.

FIG. 6 illustrates a portion of the integrated circuit 2 of FIG. 1 in more detail. The scalar processor 14 is provided with a scalar instruction register 32 (which is part of the VLIW instruction register 12) for storing a scalar instruction to be executed. An instruction decoder 34 is responsive to the scalar instruction in the scalar instruction register 32 to generate control signals supplied to data processing circuitry 36. The data processing circuitry 36 performs data processing operations in response to the control signals supplied thereto in order to perform the desired data processing operations specified by the instruction within the scalar instruction register 32. The instruction decoder 34 is circuitry configured to be responsive to the bit patterns within the scalar instruction register 32 to generate the desired control signals for supply to the data processing circuitry 36. The data processing circuitry 36 typically includes a wide variety of different functional elements, such as an adder 38, a shifter 40 and general purpose combinatorial logic 42. It will be appreciated that a wide variety of other forms of circuitry may be provided within the data processing circuitry 36 to achieve the desired functions. It will further be appreciated that the selection of which program instructions are to be supported by the instruction decoder 34 is a critical one in system design. A general purpose processor can normally accomplish most processing tasks desired if enough program instructions and processor cycles are dedicated to those tasks. However, this is not sufficient when high efficiency is also required as it is desirable to perform such processing as quickly and with low energy consumption. In this way, the selection of which processing operations are to be supported within the instruction bit space and natively supported by the data processing circuitry 36 is critical in achieving good levels of efficiency. The present techniques concern the identification and selection of particular forms of data processing instruction which are surprisingly advantageous and accordingly desirable to support natively.

Figure 7:
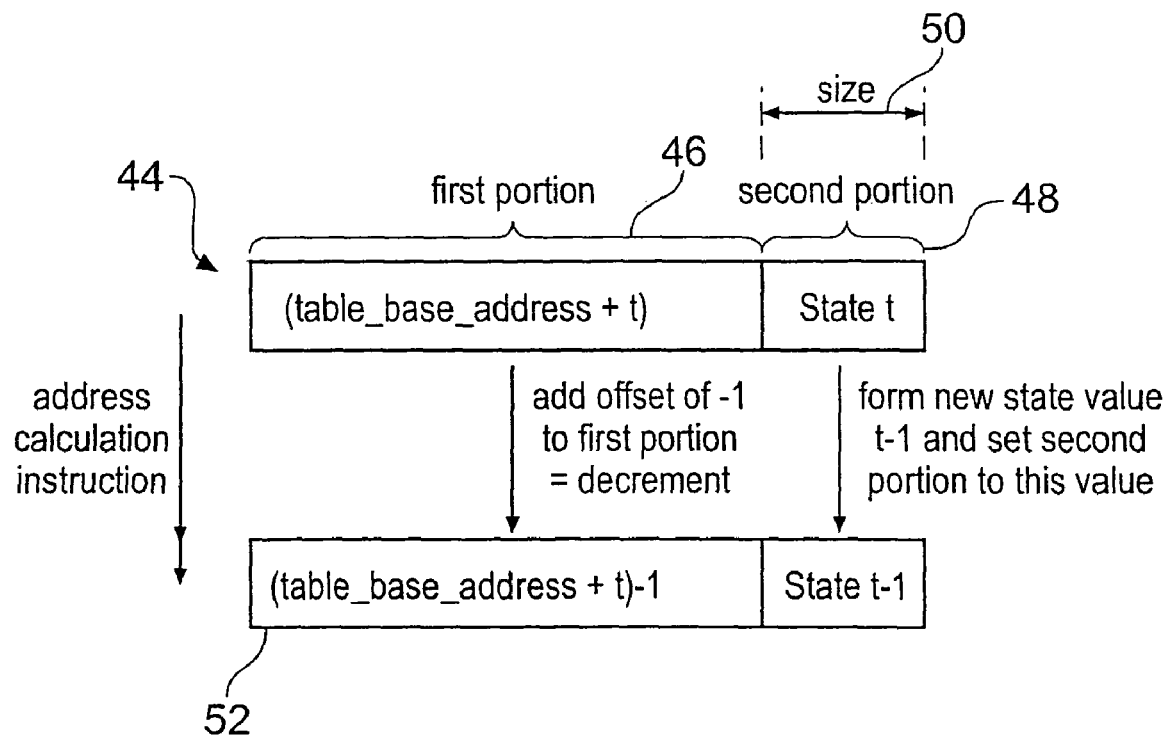
FIG. 7 schematically illustrates the operation of an address calculation instruction.

FIG. 7 illustrates the operations performed by an address calculation instruction supported by the instruction decoder 34 and the data processing circuitry 36. The input address value 44 is divided into a first portion 46 and a second portion 48 in dependence upon a size value 50. The size value 50 is in this example specified as a value representing the logarithm of the size of a mask to be applied to the input address value 44 to split it into the first portion 46 and the second portion 48. Also supplied as input operands to the address calculation instruction in this example are an offset value stored within a register specified as a register field within the instruction and a state value stored within a register specified as a register field within the instruction. The address calculation instruction serves to add an offset value to the first portion 46. In the example illustrated, this offset value is "−1", which effectively results in a decrement of the first portion. If the first portion is indexing a two dimensional data array, then the high order bits of the first portion can be considered to form the base address for that two dimensional array and the lower bits of the first portion represent the row address within that array. In this case the array is aligned—more generally the high order bits are the base address plus the row address. The number of bits of this lower portion of the first portion representing the row address varies depending upon the row size. In the example of Viterbi trellis data, each row can correspond to a different time t with data values corresponding to the different decoder states at that time t.

The manipulation performed upon the second portion 48 of the input address value 44 is to set the second portion 48 to a value specified by the State input operand being a value held within a register specified by a register field within the address calculation instruction and subject to masking of that state value to select the relevant bits thereof which are to be used as the second portion 48.

In this way, a new address can be formed as the output address value 52 by adding an offset value to the most significant bit portion of the input address value and setting the least significant bit portion of the input address value to a new value which can effectively randomly be selected. Thus, if a two dimensional data structure is considered, the modification to the first portion 46 steps through the rows of the data structure in a regular fashion (e.g. one row at a time, two rows at as time etc) with the setting of the second portion 48 of the address value allowing a random column position within the two-dimensional data structure to be selected for access using the output address value calculated.

In the context of traversing Viterbi trellis data it will be seen that this instruction is well suited to this task since such trellis data is regularly traversed, typically one row at a time, with a random next column needing to be accessed at each access. Thus, by appropriately loading the state value into the register to be used to form the second portion, and setting the desired offset, the new address following a trace back step can be calculated with a single instruction.

Figure 8:
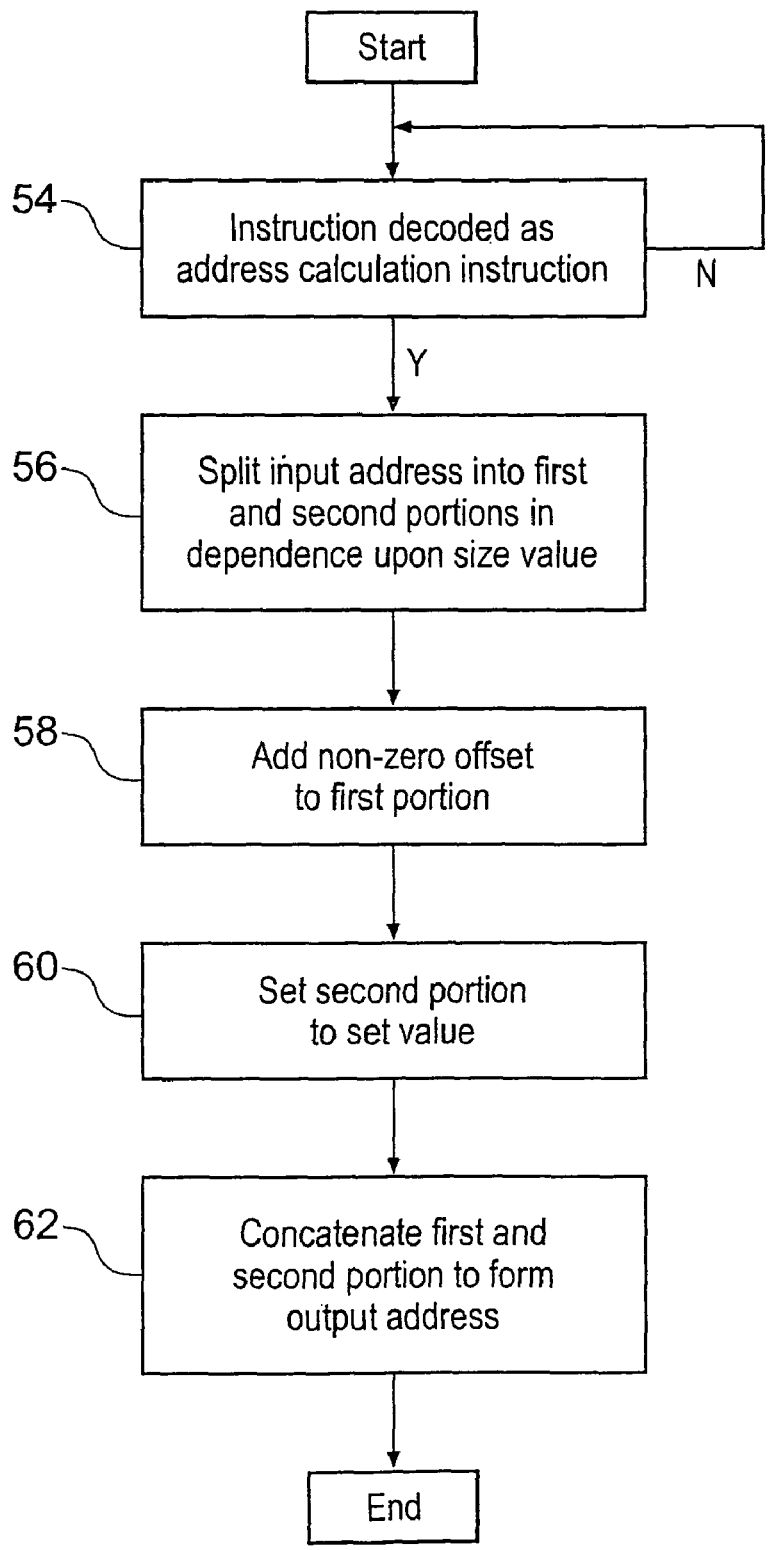
FIG. 8 is a flow diagram schematically illustrating the processing performed by an address calculation instruction.

FIG. 8 schematically illustrates the operation of the instruction decoder 34 when encountering an address calculation instruction. At step 54, the instruction decoder 34 identifies the scalar instruction within the scalar instruction register 32 as an address calculation instruction. At step 56 the input address value is split into a first portion and a second portion in dependence upon the size value specified in association with the address calculation instruction. At step 58 a non-zero offset (which may be positive or negative) is added to the first portion. At step 60 the second portion is set to a value determined directly or indirectly from the address calculation instruction. At step 62 the first portion and the second portion which have been modified are concatenated to form the output address value 52.

It will be appreciated that the sequence of operations shown in FIG. 8 is linear whereas in practice these operations may be performed in a different order and/or with varying degrees of parallelism. FIG. 8 is intended to represent the functionality provided rather than the precise way in which such functionality is provided. The various options for the provision of this functionality will be familiar to those in this technical field.

FIG. 9 schematically illustrates the syntax of an address calculation instruction in accordance with the present technique. As will be seen, the instruction includes a field identifying a register storing the offset value to be used, a field identifying a register storing a value at least part of which is to be used to set the second portion when forming the output address value and further a field (in this case an immediate) specifying a size value to be used when dividing the input address value into a first portion and a second portion. The variability of the size value allows different widths of two dimensional data array to be appropriately addressed using the address calculation instruction depending upon the circumstances.

FIG. 10 schematically illustrates the operations to be performed as part of traceback when updating a decoder state value. FIG. 10 illustrates the example in which the state value is left shifted and a new bit value is inserted in the least significant bit positions. As illustrated in FIG. 10, a first input value 64 is provided in conjunction with a second input value 66. The operation of the select-and-insert instruction is to use, in this example, the bottom three bits of the first input value 64 to select a bit within the second input value 66 which is to be inserted in the least significant bit position of the new value to be formed as the output value 68 after it has been left shifted and had the bit inserted at its least significant bit position. It will be appreciated that the width of the portion of the first input value 64 used to select the bits or bit within the second input value 66 to be inserted can vary depending upon the width of the second input value 66. Similarly, the number of bits to be inserted with each instruction can vary and be more generally N bits. In many circumstances, such as a simple-Viterbi traceback, the shift by one bit position and the inserting of one bit will be normal.

FIG. 11 illustrates a variant of the shift-and-insert instruction, with in this case the first input operand 70 being subject to a right shift and the selected bit or bits from the second input value 72 being inserted at the most significant bit position within the new state value. The state value in this example is M bits wide and accordingly there are $2^M$ possible one bit shift values which can be selected within the second input value 72 for insertion. The output value 74 represents the traceback Viterbi decoder state at time t-1.

It will be appreciated from FIGS. 10 and 11 that the second input values 66, 72 includes more than just the bit(s) which are to be inserted and used to update the state values when these are shifted. This is advantageous since the second input value 66, 72 can be fetched from memory by an instruction issued several cycles earlier before it is known precisely which of the bits from that fetched value will need to be inserted within the state value to update the state value when that update is required. Thus, the latency associated with the memory access can effectively be hidden by fetching more than just the bit(s) which will be required and then later selecting the desired bit(s) from the fetched second input value to perform the desired update. In practice memories are accessed with access mechanisms/path wider than a single bit (e.g. typically byte or word access) and accordingly the fetching of more than just the single bit or N bits required to be inserted does not in practice consume more energy than would otherwise be the case.

Figure 12:
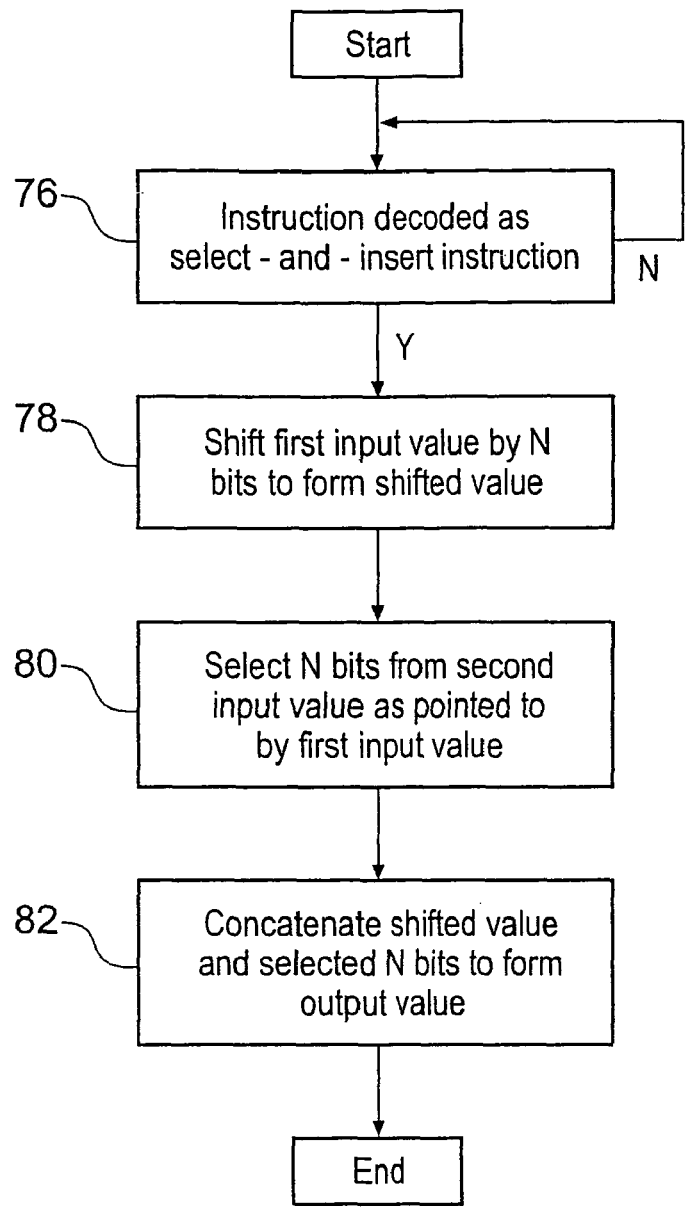
FIG. 12 is a flow diagram schematically illustrating the operation of a select-and-insert instruction.

FIG. 12 is a flow diagram schematically illustrating the processing performed by the select-and-insert instructions of FIGS. 10 and 11. At step 76 the instruction decoder 34 identifies from the bit pattern within the scalar instruction register 32 that a select-and-insert instruction has been received. It then generates the appropriate control signals to configure the data processing circuitry 36 to perform the above described data processing operations. At step 78 the first input value is shifted by N bits to perform a shifted value. At step 80, N bits are selected from the second input value, as pointed to by the first input value. More specifically the selected bits from within said second input value are bits (K*N) to (K*N)+(N−1) where K is the bottom M bits of the first input value. In this case, Viterbi trellis data value includes $2^M$ possible N bit portions to be concatenated with said shifted value permitting up to M cycles to load said Viterbi trellis data value from said memory whilst permitting said data processing circuitry to executes a sequence of said select-and-insert instructions in a manner providing a throughput capable of forming one output value per clock cycle. At step 82 the shifted value and the selected N bits are concatenated to form the output value. As previously discussed, it will be appreciated that the flow diagram of FIG. 12 represents the processing as sequential operations, but it will be appreciated that in practice this could be performed in a different order and with varying degrees of parallelism.

Figure 13:
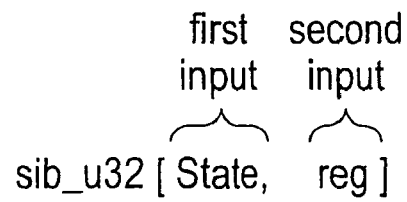
FIG. 13 illustrates the syntax of a select-and-insert instruction.

FIG. 13 schematically illustrates the syntax of a select-and-insert instruction. This instruction includes a first input operand and a second input operand, each in the form of a register specifier pointing to a register holding respectively the current state value and trellis data value as part of the Viterbi decoding.

FIG. 14 is an example code sequence showing the use of the address calculation instruction and the shift-and-insert instruction in a code fragment for performing Viterbi trace back operations. In this example it will in particular be seen that the first triplet of instructions terminates with a load to register d4 and this value is not needed until that triplet of instructions is returned to in the next loop cycle. This permits the latency associated with this load to be tolerated without stalling the instruction processing. Furthermore, since the value within the register d4 contains more than just the bits which are to be inserted, the various options for which bits will be inserted can be catered for.

Figure 15:
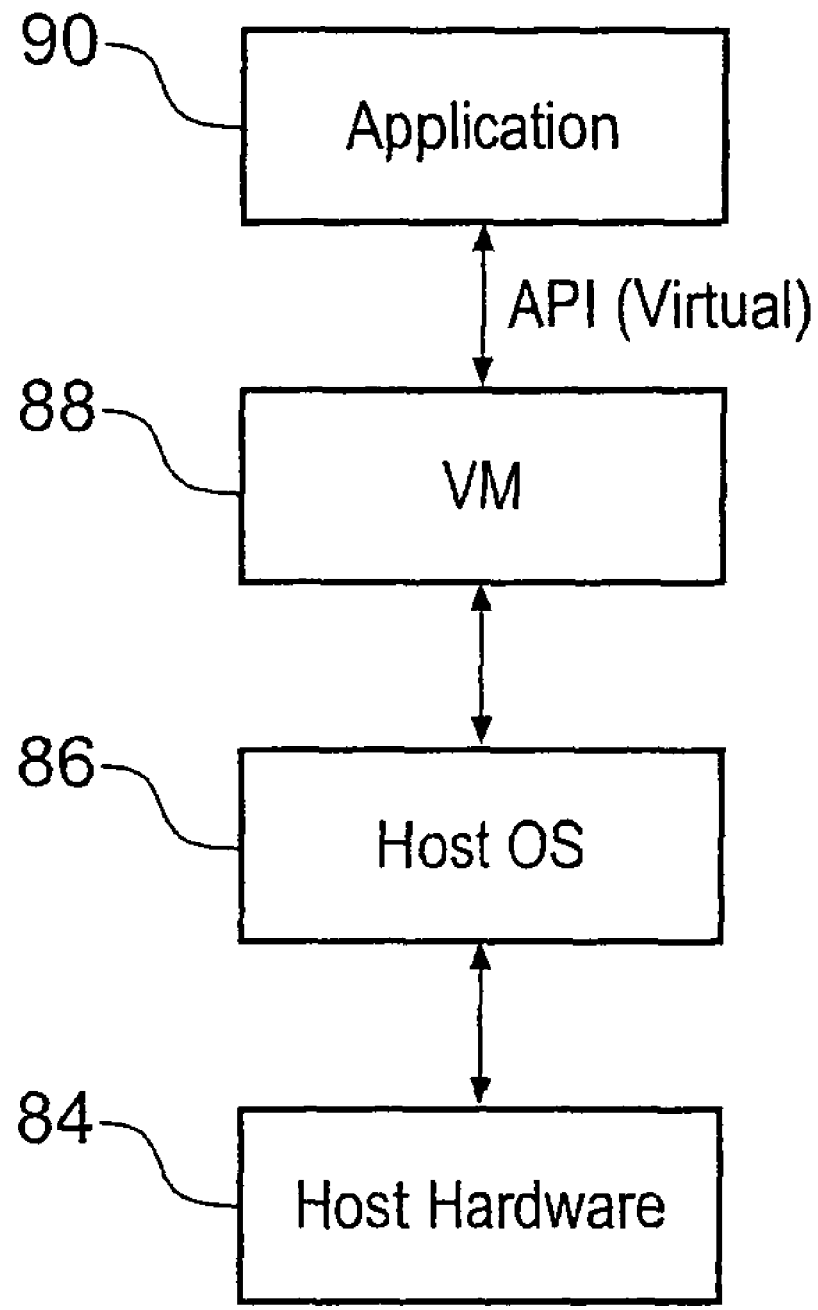
FIG. 15 is a diagram schematically illustrating a virtual machine implementation for executing program code utilising the address calculation instruction and select-and-insert instruction of the current techniques.

FIG. 15 illustrates a virtual machine implementation of the present techniques. It will be appreciated that the above has described the implementation of the present invention in the terms of apparatus and methods for operating specific processing hardware supporting the instructions concerned. It will be appreciated by those in this technical field that it is also possible to provide so called "virtual machine" implementations of hardware devices. These virtual machine implementations run on a host processor 84 running a host operating system 86 supporting a virtual machine program 88. Typically large powerful processors are required to provide virtual machine implementations which execute at a reasonable speed, but such an approach may be justified in certain circumstance, such as a desire to run code native to another processor for compatibility or reuse reasons. The virtual machine program 88 provides an application program interface to an application program 90 which is the same as the application program interface which would be provided by the real hardware which is the device being modelled by the virtual machine program 88. Thus, the program instructions, including the address calculation instruction and the select-and-insert instruction described above, may be executed from within the application program 90 using the virtual machine program 88 to model their interaction with the virtual machine hardware.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data comprising:
   data processing circuitry responsive to control signals to perform data processing operations; and
   instruction decoder circuitry coupled to said data processing circuitry and responsive to program instructions to generate said control signals; wherein
   said instruction decoder circuitry is responsive to a select-and-insert instruction having as input operands at least a first input value and a second input value to generate control signals to control said data processing circuitry to form an output value equal to that given by performing the steps of:
   shifting said first input value by N bit positions to form a shifted value, where N is an integer value greater than zero;
   selecting N bits from within said second input value in dependence upon said first input value; and
   concatenating said shifted value and said N bits to form said output value.

2. Apparatus as claimed in claim 1, wherein said first input value is left-shifted and said N bits are concatenated with said shifted value to form N least significant bits of said output value.

3. Apparatus as claimed in claim 1, wherein said first input value is right-shifted and said N bits are concatenated with said shifted value to form N most significant bits of said output value.

4. Apparatus as claimed in claim 1, wherein N=1.

5. Apparatus as claimed in claim 1, wherein said first input value is a Viterbi decoder state value and said second input value is a Viterbi trellis data value.

6. Apparatus as claimed in claim 5, wherein said Viterbi trellis data value is a mulitbit data value loaded from a memory by a load instruction executed in a processing cycle preceding a processing cycle in which said select-and-insert instruction is executed.

7. Apparatus as claimed in claim 6, wherein said Viterbi trellis data value includes $2^M$ possible N bit portions to be concatenated with said shifted value permitting up to M cycles to load said Viterbi trellis data value from said memory whilst permitting said data processing circuitry to executes a sequence of said select-and-insert instructions in a manner providing a throughput capable of forming one output value per clock cycle.

8. Apparatus as claimed in claim 7, wherein said N bits selected from within said second input value are bits (K*N) to (K*N)+(N−1) where K is the bottom M bits of the first input value.

9. Apparatus as claimed in claim 1, wherein
   said instruction decoder circuitry is responsive to an address calculation instruction having as input operands at least an input address value and a size value to generate control signals to control said data processing circuitry to calculate an output address value equal to that given by performing the steps of:

splitting said input address value at a position dependent upon said size value into an input first portion and an input second portion;

adding a non-zero offset value to said input first portion to form an output first portion;

setting an output second portion to a value; and concatenating said output first portion and said output second portion to form said output address value.

10. A method of processing data using data processing circuitry responsive to control signals to perform data processing operations and instruction decoder circuitry coupled to said data processing circuitry and responsive to program instructions to generate said control signals, said method comprising the steps of:

decoding a select-and-insert instruction having as input operands having as input operands at least a first input value and a second input value to generate control signals;

controlling said data processing circuitry with said control signals to calculate an output value equal to that given by performing the steps of:

shifting said first input value by N bit positions to form a shifted value, where N is an integer value greater than zero;

selecting N bits from within said second input value in dependence upon said first input value; and concatenating said shifted value and said N bits to form said output value.

11. A method as claimed in claim 10, wherein said first input value is left-shifted and said N bits are concatenated with said shifted value to form N least significant bits of said output value.

12. A method as claimed in claim 10, wherein said first input value is right-shifted and said N bits are concatenated with said shifted value to form N most significant bits of said output value.

13. A method as claimed in claim 10, wherein N=1.

14. A method as claimed in claim 10, wherein said first input value is a Viterbi decoder state value and said second input value is a Viterbi trellis data value.

15. A method as claimed in claim 14, wherein said Viterbi trellis data value is a mulitbit data value loaded from a memory by a load instruction executed in a processing cycle preceding a processing cycle in which said select-and-insert instruction is executed.

16. A method as claimed in claim 15, wherein Viterbi trellis data value includes $2^M$ possible N bit portions to be concatenated with said shifted value permitting up to M cycles to load said Viterbi trellis data value from said memory whilst permitting said data processing circuitry to executes a sequence of said select-and-insert instructions in a manner providing a throughput capable of forming one output value per clock cycle.

17. A method as claimed in claim 16, wherein said N bits selected from within said second input value are bits (K*N) to (K*N)+(N−1) where K is the bottom M bits of the first input value.

18. A method as claimed in claim 10, comprising decoding an address calculation instruction having as input operands at least an input address value and a size value to generate control signals; and control said data processing circuitry using said control signals to calculate an output address value equal to that given by performing the steps of:

splitting said input address value at a position dependent upon said size value into an input first portion and an input second portion;

adding a non-zero offset value to said input first portion to form an output first portion;

setting an output second portion to a value; and concatenating said output first portion and said output second portion to form said output address value.

19. Apparatus for processing data comprising:

data processing means for performing data processing operations in response to control signals; and instruction decoder means coupled to said data processing means for generating said control signals in response to program instructions; wherein said instruction decoder means, in response to a select-and-insert instruction having as input operands at least an first input value and a second input value, generates controls signals to control said data processing means to calculate an output value equal to that given by performing the steps of:

shifting said first input value by N bit positions to form a shifted value, where N is an integer value greater than zero;

selecting N bits from within said second input value in dependence upon said first input value; and concatenating said shifted value and said N bits to form said output value.

20. A host processor comprising a non-transitory storage medium including a virtual machine implementation of an apparatus for processing data, said virtual machine implementation being responsive to a select-and-insert instruction having as input operands at least an first input value and a second input value to calculate an output value equal to that given by performing the steps of:

shifting said first input value by N bit positions to form a shifted value, where N is an integer value greater than zero;

selecting N bits from within said second input value in dependence upon said first input value; and concatenating said shifted value and said N bits to form said output value.

* * * * *